United States Patent
Piret et al.

(10) Patent No.: US 8,132,078 B2
(45) Date of Patent: Mar. 6, 2012

(54) DECODING METHOD FOR ALGEBRAIC GEOMETRIC CODES AND ASSOCIATED DEVICE

(75) Inventors: Philippe Piret, Lasne (BE); Philippe Le Bars, Thorigne-Fouillard (FR)

(73) Assignee: Canon Kabushiki Kaisha, Tokyo (JP)

( * ) Notice: Subject to any disclaimer, the term of this patent is extended or adjusted under 35 U.S.C. 154(b) by 1231 days.

(21) Appl. No.: 11/722,465

(22) PCT Filed: Dec. 22, 2005

(86) PCT No.: PCT/IB2005/004034
§ 371 (c)(1),
(2), (4) Date: Jun. 21, 2007

(87) PCT Pub. No.: WO2006/067628
PCT Pub. Date: Jun. 29, 2006

(65) Prior Publication Data
US 2008/0270873 A1    Oct. 30, 2008

(30) Foreign Application Priority Data
Dec. 23, 2004 (FR) ..................... 04 13840

(51) Int. Cl.
*H03M 13/00* (2006.01)
(52) U.S. Cl. .................. 714/776; 714/752; 714/785
(58) Field of Classification Search .................. 714/752, 714/785, 800, 784, 755, 776
See application file for complete search history.

(56) References Cited

U.S. PATENT DOCUMENTS

| | | | |
|---|---|---|---|
| 5,905,739 A | 5/1999 | Piret et al. | 371/37.01 |
| 6,249,669 B1 * | 6/2001 | Ogino et al. | 455/63.1 |
| 6,543,021 B1 | 4/2003 | Piret | 714/752 |
| 6,578,170 B1 | 6/2003 | Piret et al. | 714/758 |
| 6,578,171 B1 | 6/2003 | Braneci et al. | 714/786 |
| 6,631,172 B1 * | 10/2003 | Shokrollahi et al. | 375/340 |
| 6,634,007 B1 * | 10/2003 | Koetter et al. | 714/784 |
| 6,638,318 B1 | 10/2003 | Piret et al. | 718/781 |
| 6,766,489 B1 | 7/2004 | Piret et al. | 714/755 |
| 6,910,006 B2 | 6/2005 | Piret | 704/203 |
| 6,993,698 B2 | 1/2006 | Piret | 714/755 |
| 7,069,492 B2 | 6/2006 | Piret | 714/762 |
| 7,256,717 B2 | 8/2007 | Piret et al. | 341/58 |
| 7,412,641 B2 * | 8/2008 | Shokrollahi | 714/776 |

(Continued)

FOREIGN PATENT DOCUMENTS
EP    1 434 132 A1    6/2004
(Continued)

OTHER PUBLICATIONS

Blahut, R.E., "Theory and practice of error-control codes", Addison Wesley, Reading, MA, pp. 94-96, Chapter 5.1, 1983.

(Continued)

*Primary Examiner* — Fritz Alphonse
(74) *Attorney, Agent, or Firm* — Fitzpatrick, Cella, Harper & Scinto

(57) ABSTRACT

A method of decoding a one-point algebraic geometric code defined on an algebraic curve of type C(a,b) represented by an equation $F(X,Y)=0$ of degree b in X and of degree a in Y over $F_q$, includes calculating extended error syndromes $(\sigma_j(i))$ associated with a received word (r) and determining the values of errors in each component $r(x,y_p,(x))$ of the received word r, on the basis of the extended error syndromes calculated.

20 Claims, 3 Drawing Sheets

U.S. PATENT DOCUMENTS

| | | | |
|---|---|---|---|
| 2004/0117719 A1 | 6/2004 | Lehobey et al. | 714/781 |
| 2004/0194006 A1 | 9/2004 | Piret et al. | 714/800 |
| 2005/0015704 A1 | 1/2005 | Piret et al. | 714/781 |
| 2005/0138533 A1 | 6/2005 | Le Bars et al. | 714/784 |
| 2005/0188291 A1 | 8/2005 | Piret et al. | 714/752 |
| 2005/0204268 A1 | 9/2005 | Piret et al. | 714/781 |
| 2005/0257115 A1 | 11/2005 | Piret et al. | 714/752 |

FOREIGN PATENT DOCUMENTS

| | | |
|---|---|---|
| FR | 2 871 311 A | 12/2005 |
| FR | 2 873 875 A | 2/2006 |
| FR | 2 878 096 A | 5/2006 |
| WO | WO 2004/047306 A1 | 6/2004 |

OTHER PUBLICATIONS

Blahut, R.E., Theory and Practice of Error Control Codes, Addison Wesley, Reading, MA, pp. 119-123, Chapter 5.8, 1984.

Friedman, A. et al., "The IMA Volumes in Mathematics and Its Applications", vol. 20, Springer-Verlag, Berlin, pp. 137-162, 1990.

Hoholdt, T., et al., "On the Decoding of Algebraic-Geometric Codes", IEEE Transactions on Information Theory, vol. 41, No. 6, Nov. 1995, pp. 1589-1614.

Skorobogatov, A.N., et al., "On the Decoding of Algebraic-Geometric Codes", IEEE Transactions on Information Theory, vol. 36, No. 5, Sep. 1990, pp. 1051-1060.

Sakata S., et al., "Generalized Berlekamp-Massey Decoding of Algebraic-Geometric Codes up to Half the Feng-Rao Bound", IEEE Transactions on Information Theory, vol. 41, No. 6, Nov. 1990, pp. 1762-1768.

van Lint, J.H., et al. "Algebraic Geometry Codes", Introduction to Coding Theory, 3$^{rd}$ Edition, Chapter 10, Springer-Verlag, 1999.

Leonard, D.A., "A Generalized Forney Formula for Algebraic-Geometric Codes", IEEE Transactions on Information Theory, vol. 42, No. 4, Jul. 1996, pp. 1263-1268.

Little, J.B., "A Key Equation and the Computation of Error Values for Codes from Order Domains", published on Internet, Apr. 7, 2003.

O'Sullivan, M.E., "Decoding of Codes Defined by a Single Point on a Curve", IEEE Transactions on Information Theory, vol. 41, No. 6, Nov. 1995, pp. 1709-1719.

H. Stichtenoth, Algebraic Function Fields and Codes: Foundations of the Theory of algebraic Function Fields, Chapter 1, Springer-Verlag, pp. 1-29 (1993).

T. Hoholdt, "Algebraic Geometry Codes", Handbook of Coding Theory, Elsevier Science, pp. 871-961 (1998).

M.E. O'Sullivan, "A Generalization of the Berlekamp-Massey-Sakata Algorithm", http://www-rohan.sdsu.edu/mosullv/Papers/bmsalg6.ps.gz (retrieved Jun. 15, 2001).

G. Feng, et al., "Reflections on the 'Decoding of Algebraic-Geometric Codes up to the Designed Minimum Distance'" (1998).

R. Kötter, "A fast parallel implementation of a Berlekamp-Massey algorithm for algebraic-geometric codes", Linköping, Sweden, Dissertation No. 419, Department of Electrical Engineering, Linköping University, ch. 3 and 5 (1996).

G. Forney, Jr., "On Decoding BCH Codes", IEEE Transactions on Information Theory, vol. IT-11, No. 4, pp. 549-557 (Oct. 1965).

M.E. O'Sullivan, "The key equation for one-point codes and efficient error evaluation", Journal of Pure and Applied Algebra 169 pp. 295-320 (2002).

H. Matsui, et al., "Footprint of Polynomial Ideal and Its Application to Decoder for Algebraic-Geometric Codes", Int'l Symposium on Information Theory and its Applications, ISITA 2004, Parma, Italy, pp. 1473-1478 (Oct. 10-13, 2004).

S. Miura et al., "Geometric-Goppa Codes on Some Maximal Curves and Their Minimum Distance", Institute of Electronics, Information and Communication Engineers Meeting of Technical Group on Information Theory (Mar. 1993).

N. Kamiya, et al., "On a recursive decoding algorithm for certain Geometric-Goppa codes", C&C Information Technology Research Laboratories, NEC Corporation, Japan (1993).

S. Miura, et al., "On the Minimum Distance of Codes from some Maximal Curves", C&C Information Technology Research Laboratories, NEC Corporation (Mar. 1993).

N. Kamiya, et al., "On application of the Sakata algorithm to Modified decoding algorithm for certain Geometric-Goppa codes," C&C Information Technology Research Laboratories, NEC Corporation, Japan (1992).

* cited by examiner $i = q - 2, q - 1, \ldots 1, 0$ ;

DECODING METHOD FOR ALGEBRAIC GEOMETRIC CODES AND ASSOCIATED DEVICE

The present invention concerns systems for communication or recording of data in which the data are subjected to a channel encoding in order to improve the fidelity of the transmission or storage. It concerns more particularly a decoding method, as well as the devices and apparatus adapted to implement this method.

It will be recalled that channel "block" encoding consists of transmitting "codewords" to a receiver (or recording them on a data carrier) that are formed by introducing a certain level of redundancy into the data to transmit. Considering in more detail, by means of each codeword, the information is transmitted that is initially contained in a predetermined number k of symbols termed "information symbols" taken from an "alphabet" of finite size q; on the basis of these k information symbols, calculation is made of a number n>k of symbols belonging to that alphabet, which constitute the components of the codewords: $v=(v_1, v_2, \ldots, v_n)$. The set of codewords obtained when each information symbol takes some value in the alphabet constitutes a sort of dictionary referred to as a "code" of "dimension" k and "length" n.

In particular, when the size q of the alphabet is taken equal to a power of a prime number, the alphabet can be given a field structure known as a "Galois field" denoted $F_q$. For example, for q=2, $F_q$ is a binary alphabet, and for $q=2^8=256$, $F_q$ is an alphabet of bytes.

The "Hamming distance" between two words of the same length is the number of indices for which the component of the first word is different from the component of the second word. For a given code, the smallest Hamming distance between any two different words belonging to the code is termed the "minimum distance" d; this is an important parameter of the code.

Certain codes, termed "linear codes" are such that any linear combination of codewords (with the coefficients taken from the alphabet) is still a codeword. These codes can, conveniently, be associated with a matrix H of dimension (n−k)× n, referred to as a "parity check matrix": a given word v of length n is a codeword if, any only if, it satisfies the equation: $H \cdot v^T = 0$ (where the exponent T indicates the transposition); the code is then said to be "orthogonal" to the matrix H.

There is a transmission error if the difference e between a received word r and the corresponding codeword $\bar{v}$ sent by the transmitter is non-zero. It is said that the transmission errors are caused by the "channel noise". To detect possible transmission errors and if possible correct them, a decoding method is implemented at the receiver which judiciously exploits the redundancy mentioned above.

More particularly, the decoding is carried out in two main steps.

The first step consists of associating an "associated codeword" $\hat{v}$ with the received word. To do this, the decoder first of all calculates the "error syndromes vector" $s = H \cdot r^T = H \cdot e^T$ of length (n−k) (in the context of the present invention, no difference is made between the term "word" and the term "vector"). If the syndromes are all zero, it is assumed that no transmission error has occurred, and the "associated codeword" will then simply be taken to be equal to the received word. If that is not the case, it is thereby deduced that the received word is erroneous, and calculations are then performed that are adapted to estimate the value of the error e; in other words, these calculations provide an estimated value ê of the error such that (r−ê) is a codeword, which will then constitute the "associated codeword" $\hat{v}$. Usually, this first step of the decoding is divided into two distinct sub-steps: a first so-called "error locating" sub-step, during which the components of the received word are determined of which the value is erroneous, and a second so-called "error correction" sub-step, during which an estimation is calculated of the transmission error affecting those components.

The second step simply consists in reversing the encoding method. If the received word was correct, or if correction was achieved of all the transmission errors therein during the first step, this second step of course makes it possible to retrieve the k initial information symbols (before encoding) corresponding to that received word.

It will be noted that in the context of the present invention, reference will often be made to "decoding" for brevity, to designate solely the first of those steps, it being understood that the person skilled in the art is capable without difficulty of implementing the second step.

The objective usually assigned to decoding is to associate with the received word the codeword situated at the shortest Hamming distance from that received word. Reasonably, it will be attempted to identify the position of the possible errors in a received word, and to provide the correct replacement symbol (i.e. identical to the one sent by the sender) for each of those positions, each time the number of erroneous positions is at most equal to INT[(d−1)/2] (where "INT" designates the integer part) for a code of minimum distance d. For certain error configurations, it is sometimes possible to do better. However, it is not always simple to perfect a decoding algorithm achieving that performance. It should also be noted that, when the chosen algorithm manages to propose a correction for the received word, that correction is all the more reliable (at least, for most transmission channels) the smaller the number of positions it concerns.

Among known codes, "Reed-Solomon" codes may be cited, which are reputed for their efficiency. They are linear codes, of which the minimum distance d is equal to (n−k+1). The parity-check matrix H of the Reed-Solomon code of dimension k and length n (where n is less than or equal to (q−1)) is a matrix with (n−k) lines and n columns, which has the structure of a Vandermonde matrix. This parity matrix H, which may be defined for example by taking $H_{ij} = \alpha^{i(j-1)}$ ($1 \leq i \leq n-k$, $1 \leq j \leq n$), where $\alpha$ is an $n^{th}$ root of unity in $F_q$; it is then possible to label the component $v_j$ where $1 \leq j \leq n$, of any codeword $v = (v_1, v_2, \ldots, v_n)$ by means of the element $\alpha^{(j-1)}$ of $F_q$; it is for this reason that a set such as $(1, \alpha, \alpha^2, \ldots, \alpha^{n-1})$ is termed "locating set" of the Reed-Solomon code.

Like all codes, Reed-Solomon codes may be "modified" and/or "shortened". It is said that a given code $C_{mod}$ is a "modified" version of the code C if there is a square non-singular diagonal matrix A such that each word of $C_{mod}$ is equal to v·A with v being in C. It is said that a given code is a "shortened" version of the code C if it comprises solely the words of C of which, for a number R of predetermined positions, the components are all zero: as these positions are known to the receiver, their transmission can be obviated, such that the length of the shortened code is (n−R).

As mentioned above, the step of a method of decoding during which a "codeword associated with the received word" is calculated is usually divided into two sub-steps: the first sub-step referred to as an "error locating" sub-step, consists of identifying in the received word any components whose value is erroneous; and the second sub-step consists then of calculating the corrected value of those erroneous components.

For the decoding of Reed-Solomon codes, as regards error locating, use is usually made of the algorithm known as the "Berlekamp-Massey" algorithm, which will now be briefly described: firstly a matrix S is constructed, termed "syndromes matrix", of which each element is a certain component of the error syndromes vector $\underline{s}=H\cdot \underline{r}^T=H\cdot \underline{e}^T$; next a vector $\underline{\Lambda}$ is sought such that $\underline{\Lambda}\cdot S=0$, then an "error locating polynomial" $\Lambda(Z)$ is formed of which the coefficients are components of the vector $\underline{\Lambda}$; the inverses of the roots of that polynomial $\Lambda(Z)$ are then, among the elements $\omega_i$ (where i=1, ..., n) of the locating set, those which label the erroneous components of the received word $\underline{r}$.

As regards the error correction, use is usually made of the algorithm known as the "Forney" algorithm which will now be briefly described. The error calculating polynomial $\Omega(Z)=\Lambda(Z)S(Z)$ modulo $Z^{n-k}$ is constructed, where $$S(Z) = \sum_{i=0}^{n-k-1} s_i Z^i$$

and the $s_i$ are the components of the error syndromes vector $\underline{s}$; the errors are then given, for i=1, ..., n, by:

$$e_i = \begin{cases} 0 & \text{si } \Lambda(\omega_i^{-1}) \neq 0 \\ -\frac{\Omega(\omega_i^{-1})}{p_i \Lambda'(\omega_i^{-1})} & \text{si } \Lambda(\omega_i^{-1}) = 0 \end{cases},$$

where $\Lambda'(Z)$ designates the derivative of $\Lambda(Z)$, and $p_i$ is equal to 1 for a "standard" Reed-Solomon code and to the diagonal element in position (i,i) of the matrix P for a modified code (see above).

For more details on Reed-Solomon codes, and in particular the algorithms of Berlekamp-Massey and of Forney, reference may for example be made to the work by R. E. Blahut entitled "*Theory and practice of error-control codes*", Addison-Wesley, Reading, Mass., 1983.

For modern information carriers, for example on computer hard disks, CDs ("compact discs") and DVDs ("digital video discs"), it is sought to increase the density of information. When such a carrier is affected by a physical defect such as a scratch, a high number of information symbols may be rendered unreadable. This problem may nevertheless be remedied by using a very long code. However, as indicated above, the length n of the words in Reed-Solomon codes is less than the size q of the alphabet of the symbols. Consequently, if a Reed-Solomon code is desired having codewords of great length, high values of q must be envisaged, which leads to costly implementations in terms of calculation and storage in memory. Moreover, high values of q are sometimes ill-adapted to the technical application envisaged. For this reason, it has been sought to build codes which naturally provide words of greater length than Reed-Solomon codes without however requiring a longer alphabet.

In particular so-called "algebraic geometric codes" or "Goppa geometric codes" have been proposed (see for example "*Algebraic Geometric Codes*" by par J. H. van Lint, in "*Coding Theory and Design Theory*" IMA Volumes Math. Appl., vol. 21, pages 137 to 162, Springer-Verlag, Berlin, 1990). These codes are constructed from a set of n distinct pairs (x,y) of symbols belonging to a chosen Galois field $F_q$; this set of pairs constitutes the locating set of the algebraic geometric code. In general terms, there is an algebraic equation with two unknowns X and Y such that the pairs (x,y) of that locating set are all solutions of that algebraic equation.

The values of x and y of these pairs may be considered as coordinates of "points" $P_\beta$ (where $\beta=1, ..., n$) forming an "algebraic curve".

An important parameter of such a curve is its "genus" g. In the particular case where the curve is a simple straight line (the genus g is then zero), the algebraic geometric code reduces to a Reed-Solomon code. For given q and g, certain algebraic curves, termed "maximum", make it possible to achieve a length equal to $(q+2g\sqrt{q})$, which may be very high; for example, with an alphabet size of 256 and a genus equal to 120, codewords are obtained of length 4096.

Among all the algebraic geometric codes, those usually considered are the ones which are defined on an algebraic curve represented by an equation $F(X,Y)=0$, with:

$$F(X,Y)=X^b+cY^a+\Sigma c_{ij}Y^jX^i,$$

where $c\neq 0$ and the $c_{ij}$ are elements of $F_q$, a and b are strictly positive mutually prime integers, and where the sum only applies to the integers i and j which satisfy ai+bj<ab. An equation of this form will be referred to as "of type C(a,b)", and the codes defined on a curve of type C(a,b) will be referred to as "codes of type C(a,b)". The genus g of a curve of type C(a,b) is equal to (a−1)(b−1)/2. Moreover, in the following portion of the present text, and without losing generality (given that the names "X" and "Y" of the unknowns may be exchanged), it will be assumed that a<b.

With every monomial of the form $Y^jX^i$, where i and j are positive integers or zero, a "weight" is conventionally associated, which is equal by definition to (ai+bj). It can be shown that the monomials $h_\alpha=Y^jX^i$ of weight $\rho_\alpha\leq m$, where $\alpha=1, ..., n-k$, and j is an integer between 0 and (a−1), constitute a basis of the vector space $L(mP_\infty)$ of the polynomials in X and Y with coefficients in $F_q$ of which solely the poles are situated at infinity and are of order less than or equal to m, where 0<m<n. It can also be shown that this vector space is of dimension greater than or equal to (m−g+1) (equal if m>2g−2).

For any code of type C(a,b), a parity-check matrix H is conventionally defined in the following manner: the element in line $\alpha$ and column $\beta$ of the parity-check matrix is equal to the monomial $h_\alpha$ evaluated at the point $P_\beta$ (where, it may be recalled, $\beta=1, ..., n$) of the algebraic curve. Each point $P_\beta$ then serves to identify the $\beta^{th}$ component of any codeword. A code having such a parity-check matrix is termed a "one-point" code since its parity-check matrix is obtained by evaluating (at the n points $P_\beta$) functions (the monomials $h_\alpha$) which have poles only at a single point, i.e. the point at infinity.

The codewords c are such that $H\cdot \underline{c}^T=0$ and it is possible on account of this fact in particular to designate a component of a codeword c (and also of a received word) by referring to the corresponding point $P_\beta$ in the locating set (in general itself expressed by its coordinates x, y). It can thus be said that the components of the word are "labeled" by means of the points of the locating set.

Algebraic geometric codes are advantageous as to their minimum distance d, which is at least equal to (n−k+1−g), and, as has been said, as to the length of the codewords, but they have the drawback of requiring decoding algorithms that are rather complex, and thus rather expensive in terms of equipment (software and/or hardware) and processing time. This complexity is in fact greater or lesser according to the algorithm considered, a greater complexity being in principle the price to pay for increasing the error correction capability of the decoder (see for example the article by Tom Høholdt and Ruud Pellikaan entitled "*On the Decoding of Algebraic-Geometric Codes*", IEEE Trans. Inform. Theory, vol. 41 no. 6, pages 1589 to 1614, November 1995). Generally, the higher the genus g of the algebraic curve used, the greater the length of the codewords, but also the greater the complexity of the decoding.

It is sometimes useful to shorten an algebraic geometric code. In particular, it is quite common to delete a point from the locating set, or several points, of which the x coordinate is zero.

Various error locating algorithms are known for algebraic geometric codes (defined on a curve of non-zero genus).

Such an algorithm, termed "basic" algorithm, has been proposed by A. N. Skorobogatov and S. G. Vlăduţ in the article entitled "*On the Decoding of Algebraic-Geometric Codes*", *IEEE Trans. Inform. Theory*, vol. 36 no. 5, pages 1051 to 1060, November 1990). This algorithm uses a "syndromes matrix" S, of dimension (n−k)×(n−k), of which each coefficient $S_{ij}$, where j is less than or equal to a "boundary" value w(i), is equal to a judiciously chosen linear combination of the elements $s_v$ (v=1, 2, . . . , n−k) of the syndrome s, the coefficients $S_{ij}$ beyond the boundary remaining indeterminate. The basic algorithm makes it possible to construct, on the basis of the syndromes matrix S, an "error locating polynomial" Λ(x,y), of which the zeros comprise all the pairs (x,y) labeling the positions of the received word for which the component in that position has suffered a transmission error.

Skorobogatov and Vlăduţ have also proposed, in the same article cited above, a "modified" version of the "basic" algorithm, which generally enables a higher number of errors to be corrected than the "basic" algorithm.

Algorithms are also known which operate using an iterative principle: each new iteration of such an algorithm invokes a supplementary component of the error syndromes vector $s=H \cdot r^T$.

An example of such an iterative decoding algorithm is disclosed in the article by M. Sakata et al. entitled "*Generalized Berlekamp-Massey Decoding of Algebraic-Geometric Codes up to Half the Feng-Rao Bound*" (IEEE Trans. Inform. Theory, vol 41, pages 1762 to 1768, November 1995). This algorithm can be viewed as a generalization of the Berlekamp-Massey algorithm to algebraic geometric codes defined on a curve of non-zero genus.

Another example of an iterative decoding algorithm for algebraic geometric codes has been disclosed in the article by M. E. O'Sullivan entitled "*Decoding of Codes Defined by a Single Point on a Curve*" (IEEE Trans. Inform. Theory, vol. 41, pages 1709 to 1719).

For any given received word r, it is possible to determine error locating polynomials of which the zeros comprise all the pairs (x,y) labeling the erroneous components of that received word. The set of the error locating polynomials has the structure of an ideal termed a "Gröbner ideal" (associated with the transmission errors affecting that word). It is possible to generate the Gröbner ideal by means of a finite set of f polynomials, where f≦a, which constitutes a "Gröbner basis" of the ideal. As the pairs (x,y) labeling the erroneous components of a received word of course all satisfy the equation F(X,Y)=0 of the algebraic curve, the polynomial F(X,Y) forms part of the Gröbner ideal, and it is consequently possible to reduce modulo F(X,Y) the f polynomials $G_\phi(X,Y)$ of any given Gröbner basis; the result of this is that there is always a Gröbner basis of which all the elements have a degree in Y less than a.

It is possible to obtain a Gröbner basis $G=\{G_\phi(X,Y)|\phi=1, \ldots, f\}$ from a matrix S*, of size n×n, obtained by "extending" the matrix S (in other words, the elements of S and those of S* are identical for j≦w(i) with i≦n−k). This extension is possible each time the number of errors in the received word is less than or equal to (n−k−g)/2.

Thus, when the number of errors in the received word is less than or equal to (n−k−g)/2, it is in general necessary, in order to be able to locate those errors, to know further elements of the syndromes matrix than the elements which we will qualify as "known" due to the fact that they are equal to components of the error syndromes vector $s=H \cdot r^T$ or to simple linear combinations of those components (see the numerical example described below). It is fortunately possible to calculate these elements of "unknown" value by a method comprising a certain number of "majority decisions", for example the algorithm known as the "Feng-Rao" algorithm (see article by G.-L. Feng and T. R. N. Rao entitled "*Decoding Algebraic-Geometric Codes up to the Designed Minimum Distance*>>, IEEE Trans. Inform. Theory, vol. 39, no. 1, January 1993). The object of this algorithm is essentially to extend the matrix S by means of calculation steps having the role of successive iterations. A number of iterations is necessary equal to a certain number g', where g' is at most equal to 2g, in order to reach the state where, as explained above, it becomes possible to calculate a Gröbner basis from the "extended" syndromes matrix S* so obtained. At this stage, it is also possible to calculate additional "unknown" elements of the matrix S* from elements obtained previously, either by means of new iterations of a "majority decisions" algorithm, or more conveniently by means of a certain number of relationships, known as "recursion" relationships, using "feedback polynomials" chosen from the Gröbner basis. In relation to this, reference can be made to the article by Sakata et al. cited above.

In the context of the present invention, it will be said that the elements of the syndromes matrix S* ("known" or "unknown") are "extended error syndromes".

Moreover, various algorithms are known for algebraic geometric codes making it possible to calculate the corrected value of the erroneous components of the received word; in other words, these algorithms are adapted to provide an estimated value ê of the transmission error e suffered by the transmitted codeword.

The calculation of errors for algebraic geometric codes is prima facie more complicated than for Reed-Solomon codes. This is because:
  the error locating sub-step not only produces one error locating polynomial (such as Λ(Z) above), but several polynomials, which form a Gröbner basis of the ideal of the error locating polynomials;
  these error locating polynomials are polynomials with two variables instead of one; and
  these error locating polynomials have partial derivatives with respect to those two variables, such that the conventional correction algorithms (such as the algorithm of Forney mentioned above), which involve a single derivative, are no longer applicable.

Various error value calculating algorithms are known for algebraic geometric codes.

The article "*Algebraic Geometry Codes*", by Tom Høholdt, Jacobus Van Lint and Ruud Pellikaan (Chapter 10 of the "*Handbook of Coding Theory*", North Holland, 1998) constructs the product of certain powers of the polynomials of the Gröbner basis. It then performs a linear combination of those products, allocated with appropriate coefficients. Finally it shows that the value of the polynomial so obtained, taken at the point (x,y) of the locating set, is, with the sign being the only possible difference, the value of the error for the component of the received word labeled by that point (x,y).

The article "*A Generalized Forney Formula for Algebraic Geometric Codes*" by Douglas A. Leonard (*IEEE Trans. Inform. Theory*, vol. 42, no. 4, pages 1263 to 1268, July 1996)

calculates the values of the errors by evaluating a polynomial with two variables at the points of which the coordinates are the common zeros of the error locating polynomials. The article "*A Key Equation and the Computation of Error Values for Codes from Order Domains*" by John B. Little (published on the Internet on Apr. 7, 2003) calculates the values of the errors by evaluating two polynomials with a single variable at the same points as earlier.

These three algorithms are complex to implement.

European patent application EP-1 434 132 in the name of CANON describes a decoding method applicable in particular to the one point algebraic geometric codes described above defined on an algebraic curve of type C(a,b). This decoding method performs both the location and the correction of errors. It will now be described in some detail.

This decoding method relies on the subdivision of the locating set of the code into subsets termed "aggregates". By definition, an "aggregate" groups together the pairs (x,y) of the locating set sharing the same value of x, when a<b is taken (still on the assumption that a<b, the aggregates could be defined as grouping together the pairs (x,y) of the locating set sharing the same value of y, but the first definition will be held to in what follows). When it is desired to emphasize this aggregate structure, the pairs of the locating set will be denoted $(x, y_p(x))$, where $p=1, \ldots, \lambda(x)$ and $\lambda(x)$ is the cardinal of the aggregate considered, and the components of any word c of length n will be denoted $c(x, y_p(x))$; it will be said that the components of c which, labeled in this manner, possess the same value of x form an "aggregate of components" of the word c; in particular, when it is a received word, it will be said that an aggregate associated with a value x of X is "erroneous" when there exists at least one point (x,y) of the locating set of the code such that the component of said received word labeled by that point is erroneous.

Let m be the maximum weight of the monomials defining the lines of the parity-check matrix (see above). According to application EP-1 434 132, these monomials are classified in sets of monomials $$M_j = \{Y^j X^i | 0 \leq i \leq (m-bj)/a\}$$

for $0 \leq j \leq j_{max}$, where $j_{max} < a$. The cardinal of this set $M_j$ is thus:

$$t(j) = 1 + INT[(m-bj)/a].$$

Let $x_1, \ldots, x_\mu$ denote the different values of x in the locating set, and $$\underline{v} = [v(x_1, y_1(x_1)), \ldots, v(x_1, y_{\lambda(x_1)}(x_1)), \ldots, v(x_\mu, y_{\lambda(x_\mu)}(x_\mu))],$$

denote any particular codeword. For each aggregate attached to one of the values $x_1, x_2, \ldots, x_\mu$ of x, there are constructed $(j_{max}+1)$ "aggregate symbols"

$$v_j(x) = \sum_{p=1}^{\lambda(x)} [y_p(x)]^j v(x, y_p(x))$$

for $j=0, \ldots, j_{max}$. These aggregate symbols serve to form $(j_{max}+1)$ "aggregate words"

$$\underline{v_j} = [v_j(x_1), \ldots, v_j(x_\mu)],$$

of length μ.

It is easily verified that the condition of belonging to the algebraic geometric code (i.e. $H \cdot \underline{v}^T = 0$) is equivalent to the set of $(j_{max}+1)$ equations:

$$H_{t(j)} \cdot \underline{v_j}^T = 0,$$

where the function t(j) is given above and is, by definition, $$H_t = \begin{bmatrix} 1 & 1 & \ldots & 1 \\ x_1 & x_2 & \ldots & x_\mu \\ \vdots & \vdots & \vdots & \vdots \\ x_1^{t-1} & x_2^{t-1} & \ldots & x_\mu^{t-1} \end{bmatrix}.$$

However, this matrix $H_t$ is a Vandermonde matrix defined over $F_q$; consequently, if, for each value of j, it is considered that $H_{t(j)}$ is a parity-check matrix defining a set of codewords $\underline{v_j}$, that set constitutes a Reed-Solomon code. It is then said that the algebraic geometric code considered has been "broken down" into a certain number of "component" Reed-Solomon codes.

The advantage of this formulation is that it gives decoding algorithms for Reed-Solomon codes, that are very simple, and that have a very high level of performance, at least for certain types of channels. For example, if a word r has been received, calculation is first made, for $j=0, \ldots, j_{max}$, of the "aggregate received words"

$$\underline{r_j} = [r_j(x_1), \ldots, r_j(x_\mu)],$$

in which, for $x = x_1, \ldots, x_\mu$, the "aggregate received symbols" $r_j(x)$ are given by $$r_j(x) = \sum_{p=1}^{\lambda(x)} [y_p(x)]^j r(x, y_p(x)). \quad (1)$$

Next, the Berlekamp-Massey algorithm is used for locating the erroneous symbols $r_j(x)$ of each word $\underline{r_j}$. Except for accidental compensation (the case arising) in equation (1) for a certain value of j, the aggregate received symbols $r_j(x)$ associated with an "erroneous aggregate" (see definition above) will clearly themselves also be erroneous.

Next the Forney algorithm is implemented for the correction of those erroneous symbols, according to the error syndromes vector $\underline{s_j} = H_{t(j)} \cdot \underline{r_j}^T$. Finally, calculation is made of the symbols $\hat{v}(x, y_p(x))$ of the associated codeword on the basis of the corrected symbols $\hat{r}_j(x)$ using the system of equations $$\hat{r}_j(x) = \sum_{p=1}^{\lambda(x)} [y_p(x)]^j \hat{v}(x, y_p(x)) \quad (2)$$

where j takes a number of different values (the number of equations) at least equal to $\lambda(x)$ (the number of unknowns). This decoding method thus requires that $(j_{max}+1)$ be at least equal to $\lambda_{max}$, where $\lambda_{max}$ is the greatest among the aggregate cardinals $\lambda(x)$. In what follows it will be accepted that the same condition is satisfied.

With respect to the known error correction algorithms generally applicable to the algebraic geometric codes considered, the saving in terms of complexity resulting from the implementation of the method according to application EP-1 434 132 is significant, despite the necessity to implement an error correction algorithm for Reed-Solomon code (for example the Forney algorithm) $\lambda_{max}$ times, and to solve for each erroneous aggregate labeled by a value x of X a system of equations (2); it will be noted in this connection that the number of equations in each of these systems is at most equal to a (the exponent of Y in the equation representing the algebraic curve), since the size of any aggregate (that is to say the number of solutions, for fixed x, of the equation representing the algebraic curve) is at most equal to a.

It will furthermore be noted that the system of equations (2) is a non-singular Vandermonde system: it thus always possesses one, and only one, solution; moreover, as is well known to the person skilled in the art, the solution of this type of system of linear equations is, advantageously, particularly simple.

It may furthermore be noted that the known methods for calculating the values of the errors use the syndromes $\sigma_j(i)=(\underline{Y^j X^i}, \underline{e})$, $0 \leq i$, $0 \leq j \leq a-1$ where $\underline{e}$ is the error in the received word, $\underline{Y^j X^i}$ is the word obtained by evaluation of the monomial $Y^j X^i$ at the points of the curve used to define the code and $(\underline{u},\underline{v})$ represents the scalar product of the words $\underline{u}$ and $\underline{v}$. For $0 \leq i \leq t(j)-1$, these syndromes are directly obtained as components of $H\underline{r}^T$, where H is the parity-check matrix of the algebraic geometric code and $\underline{r}$ is the received word. For $t(j) \leq i$, these syndromes remain properly calculable as soon as the weight of the error is $\leq (n-k-g)/2$. In this connection reference may be made to the article by Sakata et al. cited above. Below the vector of the $\sigma_j(i)$ placed in order of increasing i will be designated by $\underline{\sigma_j}$.

As mentioned above, the method described in the document EP-1 434 132 is designed to be implemented once the erroneous aggregates of a received word have been located. However, recourse to a preliminary locating step has the following two drawbacks:
- the implementation of the method is complicated by the fact that it must include parameters that are adjustable during the individual decoding of each received word, depending on the position of the (possible) erroneous aggregates detected during location, and
- the locating step in itself implies an operational cost.

The invention provides a method of decoding a one-point algebraic geometric code defined on an algebraic curve of type C(a,b) represented by an equation F(X,Y)=0 of degree b in X and of degree a in Y over $F_q$, characterized in that it comprises the following steps:
- calculating extended error syndromes $\sigma_j(i)$ associated with a received word $\underline{r}$;
- determining the values of errors in each component $r(x,y_p(x))$ of the received word $\underline{r}$, on the basis of the extended error syndromes calculated.

Since the error value is determined for each component, it is not necessary to have recourse to the error locating step.

For example, when the algebraic curve is partitioned into aggregates, the step of determining the values of errors in each component on the basis of the extended error syndromes comprises the following steps for each aggregate:
- calculating, on the basis of the extended error syndromes, compound error values each representing a linear combination of the errors in the components of the aggregate;
- determining that the errors in the components of the aggregate are zero if all said compound error values are zero;
- calculating the errors in the components of the aggregate if at least one of said compound error values is not zero.

Thus the authors of the present invention realized that it is possible to consider that the estimated errors $\hat{e}(x,y_p(x))$ in each component represent a "zero error" when the corresponding component $r(x,y_p(x))$ is correct; hence, by using a number of equations at least equal to the size of the aggregate, it is possible to obtain all the values of the error estimations $\hat{e}(x,y_p(x))$, whether they be zero or not. The inventors thus wondered what, in practice, would be the cost associated with the decision to process all the aggregates in advance as being potentially erroneous, which decision makes it possible not to have to distinguish between the aggregates containing errors and those which do not. In this case, as usual, the Gröbner basis of the locator polynomials would be calculated, but the trouble would not be taken to explicitly seek which are the points of the curve that are zeros common to those locators.

They then realized that the cost was in fact rather minimal, and all the more so in that, in certain conditions, the utility of this locating step is particularly mediocre: these are conditions where all, or almost all, the aggregates are erroneous, for example when the channel considered is sufficiently noisy with respect to the size of the aggregate, since the probability that a given aggregate, labeled by a value x of X, comprises at least one erroneous component is all the greater that the cardinal $\lambda(x)$ of that aggregate is great.

The calculation of the extended error syndromes $\sigma_j(i)$ is in practice performed for $j=0, \ldots, j_0-1$, where $j_0$ is at least equal to the maximum value $\lambda_{max}$ of the cardinals $\lambda(x)$ of the aggregates of the code. Sufficient equations are thus obtained to enable the possible calculation of the errors in each aggregate.

From a practical point of view, it is worthwhile deleting the pairs (x,y) for which x is zero from the locating set of the algebraic geometric code.

With this restriction, determination of the values of errors for example comprises the following steps:
- calculating $\underline{\tau_j} = \underline{\sigma_j} \cdot V^{-1}$ for $j=0, \ldots, a-1$, where $V^{-1}$ is the matrix of dimensions $(q-1) \times (q-1)$ of which the element in position (i,j), $1 \leq i,j \leq q-1$, is $\alpha^{-(i-1)(j-1)}$, $\alpha$ being a primitive element of $F_q$;
- for all h such that there is j such that the $(h+1)^{th}$ component $\tau_j(h)$ of $\underline{\tau_j}$ is non-zero, calculating the error $\hat{e}(x,y_p(x))$ of the components of the aggregate defined by $x=\alpha^h$ in the received word $\underline{r}$ by:

$$\begin{bmatrix} \hat{e}(\alpha^h, y_1(\alpha^h)) \\ \hat{e}(\alpha^h, y_2(\alpha^h)) \\ \vdots \\ \hat{e}(\alpha^h, y_{\lambda(\alpha^h)}(\alpha^h)) \end{bmatrix} =$$

$$\begin{bmatrix} 1 & \cdots & \cdots & 1 \\ y_1(\alpha^h) & \cdots & \cdots & y_{\lambda(\alpha^h)}(\alpha^h) \\ \vdots & \vdots & \vdots & \vdots \\ y_1^{\lambda(\alpha^h)-1}(\alpha^h) & \cdots & \cdots & y_{\lambda(\alpha^h)}^{\lambda(\alpha^h)-1}(\alpha^h) \end{bmatrix}^{-1} \cdot \begin{bmatrix} \tau_0(h) \\ \tau_1(h) \\ \vdots \\ \tau_{\lambda(\alpha^h)-1}(h) \end{bmatrix}$$

In a possible implementation, for each j, the calculation of the elements of the vector $\underline{\tau_j}$ is performed by a circuit comprising a shift register and receiving as input the elements of the vector $\underline{\sigma_j}$.

According to a another embodiment, determining the values of errors may comprise the following steps:
- implementing, for $j=0, \ldots, \lambda_{max}-1$, by means of the error syndromes polynomial $$S_j(Z) = \sum_{i=0}^{q-2} \sigma_j(i) Z^i,$$

an error correction algorithm adapted to Reed-Solomon codes, so as to calculate the error $E_j(x)$ in each component labeled by the element x of $F_q$ of a word of Reed-Solomon code defined over $F_q$, and calculating the estimations $ê(x,y_p(x))$ of the respective errors in the components $r(x,y_p(x))$ of $\underline{r}$ by solving the system of equations of type $$E_j(x) = \sum_{p=1}^{\lambda(x)} [y_p(x)]^j ê(x, y_p(x)), \quad (3)$$

where equations are chosen that are associated with consecutive values of j at least equal in number to the number of components $\lambda(x)$ of the aggregate considered.

The calculation of the estimations $ê(x,y_p(x))$ may then be performed only for the values of x such that there is at least one value of j for which $E_j(x)$ is non-zero, Calculation of the estimations is thus limited to certain aggregates and it is considered that the error values in the components of the other aggregates are zero.

According to a possible feature of implementation, if there is at least one value of $x=\alpha^h$ associated with an erroneous aggregate of cardinal $\lambda(x)<a$, comparison is then made between the members of at least one equation $$E_j(x) = \sum_{p=1}^{\lambda(x)} [y_p(x)]^j ê(x, y_p(x)),$$

where $\lambda(x) \le j \le a-1$, associated with said value of x, if need be after having calculated $E_j(x)$ by means of an error correction algorithm adapted to Reed-Solomon codes.

By virtue of these provisions, it will be possible to detect a possible erroneous correction should said at least one equation prove not to be satisfied by the values of $e(x,y_p(x))$ obtained previously.

According to a second aspect the invention concerns a device for correcting errors for a one-point algebraic geometric code defined on an algebraic curve of type C(a,b) represented by an equation $F(X,Y)=0$ of degree b in X and of degree a in Y over $F_q$, characterized in that it comprises:

means for calculating extended error syndromes $\sigma_j(i)$ associated with a received word $\underline{r}$;

means for determining the values of errors in each component $r(x,y_p(x))$ of the received word $\underline{r}$, on the basis of the extended error syndromes calculated.

When the algebraic curve is partitioned into aggregates, the means for determining the values of errors in each component on the basis of the extended error syndromes may comprise:

means for calculating, for each aggregate and on the basis of the extended error syndromes, compound error values $\tau_j(h)$, $E_j(x)$ each representing a linear combination of the errors in the components of the aggregate;

means for determining that the errors in the components of an aggregate are zero if all said compound error values relative to that aggregate are zero;

means for calculating the errors in the components of an aggregate if at least one of said compound error values relative to that aggregate is not zero.

Such a device may also have features corresponding to those already presented for the decoding method and the corresponding advantages arising therefrom.

The invention also relates to:

a decoder comprising at least one error correction device as described succinctly above, and at least one redundancy removal device, an apparatus for receiving encoded digital signals comprising a decoder as succinctly described above, and comprising means for demodulating said encoded digital signals, a computer system comprising a decoder as succinctly described above, and further comprising at least one hard disk as well as at feast one means for reading that hard disk, a non-removable data storage means comprising computer program code instructions for the execution of the steps of any one of the decoding methods succinctly described above, a partially or wholly removable data storage means comprising computer program code instructions for the execution of the steps of any one of the decoding methods succinctly described above, and a computer program containing instructions such that, when said program controls a programmable data processing device, said instructions cause said data processing device to implement one of the decoding methods succinctly described above.

The advantages provided by this decoder, this reception apparatus, this computer system, these data storage means and this computer program are essentially the same as those provided by the error correction methods according to the invention.

Other aspects and advantages of the invention will emerge from a reading of the following detailed description of particular embodiments, given by way of non-limiting example. The description refers to the accompanying drawings, in which.

Figure 1:
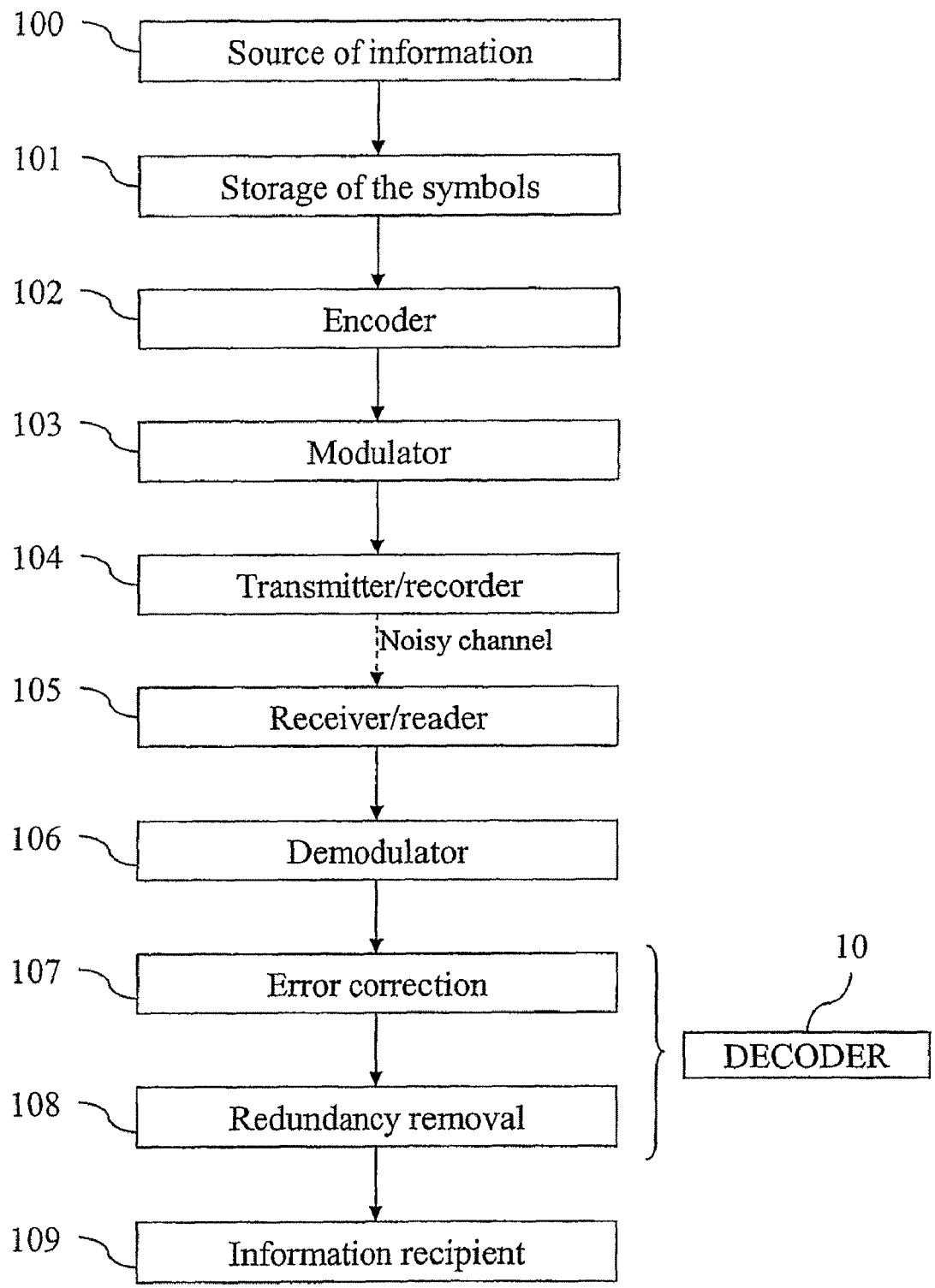
FIG. 1 is a block diagram of a system for transmitting information implementing a method according to the invention.

The function of this system is to transmit information of any nature from a source 100 to a recipient or user 109. First of all, the source 100 transforms this information into a series of symbols belonging to a certain Galois field $F_q$ (for example bytes of bits for $q=2^8$), and transmits these symbols to a storage unit 101, which accumulates the symbols so as to form sets each containing k symbols. Next, each of these sets is transmitted by the storage unit 101 to an encoder 102 which incorporates redundancy therein, so as to construct a word of length n belonging to the chosen code.

The code words so formed are next transmitted to a modulator 103, which associates a modulation symbol with each symbol of the codeword. Next, these modulation symbols are transmitted to a recorder (or a transmitter) 104, which inserts the symbols in a transmission channel. This channel may for example be storage on a suitable carrier such as a DVD or a magnetic disc or a magnetic tape. It may also correspond to be a wired transmission or wireless transmission as is the case with a radio link.

The message transmitted arrives at a reader (or a receiver) 105, after having been affected by a "transmission noise" whose effect is to modify or erase some of the modulation symbols.

The reader (or receiver) 105 then transmits these symbols to the demodulator 106, which transforms them into symbols of $F_q$. The n symbols resulting from the transmission of the same codeword are next grouped together into a "received word" in an error correction unit 107, which implements a decoding method according to the invention, so as to provide an "associated codeword". Next, this associated codeword is transmitted to a redundancy removal unit 108, which extracts from it k information symbols by implementing a decoding algorithm that is the reverse of that implemented by the encoder 102. Finally, these information symbols are supplied to their recipient 109.

Units 107 and 108 can be considered to form conjointly a "decoder" 10.

The encoding method according to the invention will now be illustrated, with the aid of a numerical example. It should be noted that this example does not necessarily constitute a preferred choice of parameters for the encoding or decoding. It is only provided here to enable the person skilled in the art to understand more easily the operation of the method according to the invention.

The designation Q will be given to the "one-point" algebraic geometric code of dimension 22 and length 60, defined in the following manner.

The alphabet of the symbols is constituted by the Galois field $F_{16}$. As the cardinal of this field is a power of 2 ($16=2^4$), the sign "+" is equivalent to the sign "−" before any coefficient of a polynomial with coefficients belonging to that field.

The following "algebraic curve" is considered of genus $g=6$ constituted by the set of the solutions $(X=x, Y=y)$ of the equation with two unknowns $$Y^4+Y+X^5=0 \qquad (4)$$

over $F_{16}$. It is found that by giving to X some particular value x in $F_{16}$, each time there are 4 values $y_p(x)$ ($p=1, 2, 3, 4$) in $F_{16}$ such that the pair $(x, y_p(x))$ is a solution of equation (4); these solutions of equation (4) are the coordinates of the "finite points of the curve" (the curve also contains a point at infinity denoted $P_\infty$). It is chosen to constitute the locating set by means of all these solutions except those where $x=0$; the locating set thus has a cardinal equal to 60, and it can be divided into 15 aggregates which each have a cardinal $\lambda(x)$ equal to 4. Generally, the designation $\lambda_{max}$ is given to the maximum value among the cardinals $\lambda(x)$ of the aggregates, here $\lambda_{max}=4$. It is recalled that each point $P_j$ of the locating set serves to identify the j-th element of any codeword; the number of such points being here equal to 60, the length n of the code is thus also equal to 60.

Next, the vector space $L(mP_\infty)$ is considered of polynomials in X and Y with coefficients in $F_{16}$ of which solely the poles are situated in $P_\infty$, and are of order less than or equal to m, where $0 \le m \le 65 = n+g-1$. This vector space, which is of dimension greater than or equal to $(m-g+1)$ (equal if $m > 2g-2$), has a base constituted by the monomials $h_i = Y^t X^u$, where t is an integer between 0 and 3, u is a positive integer or zero, $4u+5t \le m$, and $i=1, \ldots, n-k$. This quantity $\rho(h_i) = 4u+5t$ is usually called the "weight" of the monomial $h_i$.

Take for example: $m=43$; a set of monomials $h_i$ is then obtained where $i=1, \ldots, 38$, since $m-g+1=43-6+1=38$.

The monomials $h_i$ may be classified into ordered subsets of monomials $$M_t = \{Y^t X^u | 0 \le u \le (43-5t)/4\},$$

where: $0 \le t \le 3$. These ordered subsets of monomials are explicitly:

$$M_0 = \{1, X, X^2, \ldots, X^{10}\}$$

$$M_1 = \{Y, YX, YX^2, \ldots, YX^9\},$$

$$M_2 = \{Y^2, Y^2X, Y^2X^2, \ldots, Y^2X^8\}, \text{ and}$$

$$M_3 = \{Y^3, Y^3X, Y^3X^2, \ldots, Y^3X^7\}.$$

It is verified that the total number of monomials $h_i$ is indeed equal to: $11+10+9+8=38$.

Finally, the parity-check matrix H of the code is defined in the following manner: the element in line i and column j of that matrix is equal to the value taken by the monomial $h_i$ at the point $P_j$ of the algebraic curve.

The redundancy (n−k) of the code Q being equal to 38, its dimension is $k=60-38=22$. The minimum distance d of this code is at least equal to $n-k+1-g=33$.

Let the received word be the word r of weight 16, given by the following table where $\alpha$ is a primitive element of $F_{16}$ satisfying $\alpha^4 + \alpha + 1 = 0$, x and y are the coordinates of the point concerned in the locating set, and $r(x,y)$ is the component associated with (i.e. labeled by) that point. At the points $(x,y)$ of the curve not included in the table, the received symbol $r(x,y)$ has the value 0.

| x | y | r(x, y) |
|---|---|---------|
| $\alpha$ | $\alpha^{13}$ | $\alpha^{12}$ |
| $\alpha^2$ | $\alpha^3$ | $\alpha^{10}$ |
| $\alpha^3$ | $\alpha$ | $\alpha^5$ |
| $\alpha^3$ | $\alpha^2$ | $\alpha^7$ |
| $\alpha^4$ | $\alpha^{13}$ | 1 |
| $\alpha^7$ | $\alpha^7$ | $\alpha^9$ |
| $\alpha^7$ | $\alpha^9$ | $\alpha^9$ |
| $\alpha^8$ | $\alpha^{11}$ | $\alpha^2$ |
| $\alpha^8$ | $\alpha^{14}$ | 1 |
| $\alpha^8$ | $\alpha^3$ | $\alpha^2$ |
| $\alpha^9$ | $\alpha$ | $\alpha^5$ |
| $\alpha^9$ | $\alpha^8$ | $\alpha^{11}$ |
| $\alpha^9$ | $\alpha^2$ | $\alpha^{11}$ |
| $\alpha^{11}$ | $\alpha^{12}$ | $\alpha^5$ |
| $\alpha^{11}$ | $\alpha^{11}$ | $\alpha^5$ |
| $\alpha^{14}$ | $\alpha^{14}$ | $\alpha^{10}$ |

Use is then made of the "extended error syndromes" $\sigma_j(i) = \langle Y^j X^i | e \rangle$, where $e$ is the transmission error affecting the received word $r$, and $Y^j X^i$ represents the word of which the components are equal to the value taken by the monomial $Y^j X^i$ at the points of the locating set (the notation $\langle c_1 | c_2 \rangle$ represents the scalar product of any two words $c_1$ and $c_2$ of length n). In passing, it will be noted that, due to the fact that $\alpha^{q-1}=1$ for any non-zero element $\alpha$ of $F_q$, the extended error syndromes $\sigma_j(i)$ are periodic in i, with a period equal to (q−1).

In the example set out here, given the received word $r$, it is possible to calculate the 38 syndromes corresponding to the 38 lines of the parity-check matrix H. Let $\sigma_j(i)$ be the syndrome corresponding to the monomial $Y^j X^i$. These syndromes are directly obtained for the non-negative values of i and j which satisfy $0 \le i \le (43-5j)/4$, using the parity-check matrix H. For the other useful values of i and j, use is made of a method of calculating the syndromes that are referred to as "unknown". For the first unknown syndromes, this method implies majority decisions. For the other unknown syndromes, it may also be carried out by "majority" decisions which are then unanimous, or more simply by using each time one of the polynomials of the Gröbner basis produced by the decoding algorithm used. It may be recalled here that this basis of polynomials generates the ideal of the locator polynomials. In this connection reference may be made to the article by Sakata et al. mentioned above.

For $0 \leq j \leq 3$, it is thus possible to calculate $\sigma_j(i)$ for $i = 0, \ldots, 14$. By giving the designation $\underline{\sigma}_j$ to the vector of the 15 components $\sigma_j(i)$ for $i = 0, \ldots, 14$, the four following vectors are obtained:

$\underline{\sigma}_0 = [\alpha^2 \; \alpha^8 \; \alpha^2 \; \alpha \; \alpha^{14} \; \alpha^{11} \; \alpha^{14} \; \alpha^2 \; \alpha^2 \; \alpha^{14} \; 1 \; \alpha^{10} \; \alpha^5 \; \alpha^{14} \; \alpha^{14}]$, $\underline{\sigma}_1 = [\alpha^{10} \; \alpha^5 \; \alpha^{12} \; \alpha \; \alpha^8 \; \alpha^{13} \; \alpha^8 \; \alpha^8 \; \alpha^{11} \; \alpha^{10} \; \alpha^{11} \; 1 \; \alpha^{10} \; \alpha^3 \; \alpha^{13}]$, $\underline{\sigma}_2 = [\alpha \; \alpha^3 \; \alpha^{10} \; \alpha^{10} \; \alpha^5 \; \alpha^{12} \; \alpha^{13} \; \alpha^5 \; 0 \; \alpha^{11} \; \alpha^{13} \; \alpha^{12} \; \alpha^5 \; \alpha^8 \; \alpha^{10}]$, $\underline{\sigma}_3 = [0 \; \alpha^{12} \; \alpha^{13} \; 1 \; \alpha^{14} \; \alpha^{12} \; \alpha^{12} \; \alpha^9 \; \alpha^{14} \; \alpha^{11} \; 0 \; \alpha^6 \; \alpha^2]$.

On the basis of the syndromes so obtained, an error correction algorithm is implemented, for $j=0, \ldots, \lambda_{max}-1$ (i.e. for j going from 0 to 3 in the example described), that is adapted to Reed-Solomon codes, so as to calculate the errors $E_j(x)$ in the components of a word of Reed-Solomon code, defined over the same Galois field as said algebraic geometric code, the components being labeled by the $(q-1)=15$ values of x each defining an aggregate. Such an error correction is for example performed by using the error syndromes polynomials:

$$S_j(Z) = \sum_{i=0}^{q-2} \sigma_j(i) Z^i.$$

It is noted that the error correction is performed on all the aggregates, without seeking to determine beforehand whether or not the aggregate concerned is an erroneous aggregate for example by means of an error locating algorithm.

In the above example, the matrix V is used, of dimensions 15×15, of which the element in position $(i, j)$, $1 \leq i, j \leq 15$, is $\alpha^{(i-1)(j-1)}$ where $\alpha$ is a root of $X^4+X+1$. This is because it is possible to define the 15-tuples $\underline{\tau}_j = \underline{\sigma}_j V^{-1}$ which are used profitably to calculate the estimated values $\hat{e}(x, y(x))$ of the errors. It may be noted that the inverse matrix $V^{-1}$ of V is the matrix having $\alpha^{-(i-1)(j-1)}$ in position $(i,j)$. In the example treated the following is thus obtained:

$\underline{\tau}_0 = [0 \; \alpha^{12} \; \alpha^{10} \; \alpha^{13} \; 1 \; 0 \; 0 \; 0 \; 1 \; \alpha^5 \; 0 \; 0 \; 0 \; 0 \; \alpha^{10}]$, $\underline{\tau}_1 = [0 \; \alpha^{10} \; \alpha^{13} \; \alpha^5 \; \alpha^{13} \; 0 \; 0 \; \alpha^9 \; \alpha \; \alpha \; 0 \; \alpha^5 \; 0 \; 0 \; \alpha^9]$, $\underline{\tau}_2 = [0 \; \alpha^8 \; \alpha \; \alpha^8 \; \alpha^{11} \; 0 \; 0 \; \alpha^9 \; \alpha \; \alpha^8 \; 0 \; \alpha^5 \; 0 \; 0 \; \alpha^8]$, $\underline{\tau}_3 = [0 \; \alpha^6 \; \alpha^4 \; \alpha^3 \; \alpha^9 \; 0 \; 0 \; \alpha^{13} \; \alpha^{10} \; \alpha^{10} \; 0 \; \alpha^7 \; 0 \; 0 \; \alpha^7]$.

Figure 3:
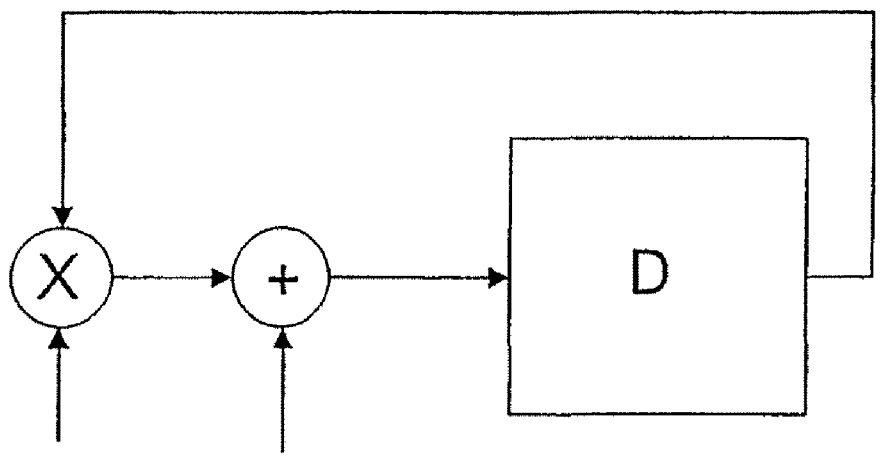
FIG. 3 represents a circuit element that can be used in an embodiment according to the invention.

It will be noted that the calculation of $\underline{\tau}_j$ from $\underline{\sigma}_j$ may advantageously be performed using shift registers. Each column of $V^{-1}$ is in fact a series of consecutive powers of the same element of $F_q$. For all fixed h, the calculation of the component $\tau_j(h)$ of $\underline{\tau}_j$ is thus easily performed by the circuit of FIG. 3, where the element D represents a delay element. Advantageously, for all j, the q−1 components $\tau_j(h)$ of $\underline{\tau}_j$ may then be calculated in parallel by circuits of the FIG. 3 type.

Thus let T be the 4×15 matrix of which the four lines are the four 15-tuples $\underline{\tau}_j$. The knowledge of this matrix T is equivalent to that of the 60 values of $E_j(\alpha^h)$ since giving the designation $\tau_j(h)$ to the element in position $(j, 1+h)$ of T gives:

$\tau_j(h) = E_j(\alpha^h)$.

This leads to a simple calculation of the errors $\hat{e}(\alpha^h, y_p(\alpha^h))$ in the following manner. Let the designation $t_h$, $h=0, \ldots, 14$, be given to the $(h+1)^{th}$ column of that matrix T, and for any such h, let there be constructed the Vandermonde matrix $V_h$ of type 4×4 based on the four elements $y_p(\alpha^h)$, $p=1, \ldots, 4$. Here is thus the form of these matrices $V_h$:

$$\begin{bmatrix} 1 & 1 & 1 & 1 \\ y_1(\alpha^h) & y_2(\alpha^h) & y_3(\alpha^h) & y_4(\alpha^h) \\ [y_1(\alpha^h)]^2 & [y_2(\alpha^h)]^2 & [y_3(\alpha^h)]^2 & [y_4(\alpha^h)]^2 \\ [y_1(\alpha^h)]^3 & [y_2(\alpha^h)]^3 & [y_3(\alpha^h)]^3 & [y_4(\alpha^h)]^3 \end{bmatrix}.$$

The column vector $\hat{e}(\alpha^h) = [\hat{e}(\alpha^h, y_1(\alpha^h)), \hat{e}(\alpha^h, y_2(\alpha^h)), \hat{e}(\alpha^h, y_2(\alpha^h)), \hat{e}(\alpha^h, y_3(\alpha^h))]^T$ (where the circumflex accent ^ indicates estimated errors and where $^T$ indicates the transposition) is then simply given by $\hat{e}(\alpha^h) = V_h^{-1} t_h$.

Preferably, it can be decided not to "materially" perform the calculation of the errors in the aggregate indexed by $\alpha^h$ when the "transformed" errors $E_j(\alpha^h)$ are all zero. This is because in this case it is certain in advance that the errors in the aggregate $\alpha^h$ will also be zero.

In summary, the four lines $\underline{\tau}_j$ of the matrix T are calculated by multiplying the four vectors of the syndromes $\underline{\sigma}_j$ (completed by the syndromes components referred to as "unknown") by $V^{-1}$ and the errors are determined in the aggregate indexed by $\alpha^h$ by multiplying the corresponding column of T by the inverse of the Vandermonde matrix based on the four values $y_p(\alpha^h)$, $p=1, \ldots, 4$, of Y such that $(\alpha^h, y_p(\alpha^h))$ is a point on $F_{16}$ of the curve $Y^4+Y+X^5=0$.

It is noted that this determination of the errors $\hat{e}(\alpha^h, y_p(\alpha^h))$ is performed directly without having beforehand and explicitly located the aggregates containing at least one error.

The passage to a more general case does not give rise to difficulties. It is still possible to calculate a vectors $\underline{\sigma}_j$ of length q−1 and the "transformed" components $E_j(x)$ of the errors are the components of the vector $\underline{\sigma}_j V^{-1}$ where V is the Vandermonde matrix based on the non-zero elements of $F_q$. If for given x, all the $E_j(x)$ are zero, it is naturally considered that the components of the received word r in the aggregate of index x are correct. On the contrary, if at fixed x there is at least one component $E_j(x)$ which is non-zero, it is considered that the aggregate of index x is erroneous and it is sought to determine the errors affecting each component $r(x, y_p(x))$ of the received word in that aggregate.

For this purpose, calculation is made for each such value of x of the estimations $\hat{e}(x, y_p(x))$ of the respective errors in the components $r(x, y_p(x))$ of the received word by solving the equation system $$E_j(x) = \sum_{p=1}^{\lambda(x)} [y_p(x)]^j \hat{e}(x, y_p(x))$$

in which equations have been chosen that are associated with consecutive values of j and are at least equal in number to the number $\lambda(x)$ of components of the aggregate indexed by x. This system contains a non-singular Vandermonde system of small size of which the vector solution formed by the components of the error in the aggregate indexed by $x=\alpha^h$ for $\alpha$ primitive in $F_q$ is given by:

$$\begin{bmatrix} e(\alpha^h, y_1(\alpha^h)) \\ e(\alpha^h, y_2(\alpha^h)) \\ \vdots \\ e(\alpha^h, y_{\lambda(\alpha^h)}(\alpha^h)) \end{bmatrix} =$$

$$\begin{bmatrix} 1 & \cdots & \cdots & 1 \\ y_1(\alpha^h) & \cdots & \cdots & y_{\lambda(\alpha^h)}(\alpha^h) \\ \vdots & \vdots & \vdots & \vdots \\ y_1^{\lambda(\alpha^h)-1}(\alpha^h) & \cdots & \cdots & y_{\lambda(\alpha^h)}^{\lambda(\alpha^h)-1}(\alpha^h) \end{bmatrix}^{-1} \cdot \begin{bmatrix} \tau_{0,h} \\ \tau_{1,h} \\ \vdots \\ \tau_{\lambda(\alpha^h)-1,h} \end{bmatrix} = \vartheta^{-1} \cdot \begin{bmatrix} \tau_{0,h} \\ \tau_{1,h} \\ \vdots \\ \tau_{\lambda(\alpha^h)-1,h} \end{bmatrix}.$$

Returning to the example described here in detail, it may be noted that, for non-zero x in fixed $F_{16}$, the four solutions of the equation $Y^4+Y+x^5=0$ in Y are of four different types:

$[\alpha\ \alpha^2\ \alpha^4\ \alpha^8]$ for $x=1, \alpha^3, \alpha^6, \alpha^9, \alpha^{12}$, $[\alpha^6\ \alpha^7\ \alpha^9\ \alpha^{13}]$ for $x=\alpha, \alpha^4, \alpha^7, \alpha^{10}, \alpha^{13}$, $[\alpha^3\ \alpha^{11}\ \alpha^{12}\ \alpha^{14}]$ for $x=\alpha^2, \alpha^5, \alpha^8, \alpha^{11}, \alpha^{14}$.

For example, the Vandermonde matrix $\theta$ constructed on $[\alpha^6\ \alpha^7\ \alpha^9\ \alpha^{13}]$ (usable for the aggregates corresponding to $x=\alpha, \alpha^4, \alpha^7, \alpha^{10}, \alpha^{13}$) is:

$$\begin{bmatrix} 1 & 1 & 1 & 1 \\ \alpha^6 & \alpha^7 & \alpha^9 & \alpha^{13} \\ \alpha^{12} & \alpha^{14} & \alpha^3 & \alpha^{11} \\ \alpha^3 & \alpha^6 & \alpha^{12} & \alpha^9 \end{bmatrix}$$

and its inverse $\theta^{-1}$ is:

$$\begin{bmatrix} \alpha^{14} & \alpha^{12} & \alpha^6 & 1 \\ \alpha^{13} & \alpha^{14} & \alpha^7 & 1 \\ \alpha^{11} & \alpha^3 & \alpha^9 & 1 \\ \alpha^7 & \alpha^{11} & \alpha^{13} & 1 \end{bmatrix}.$$

By multiplying this inverse matrix by the second column of the matrix $\tau$ corresponding to $x=\alpha$, the vector $[0\ 0\ 0\ \alpha^{12}]^T$ is obtained;

By multiplying this inverse matrix by the fifth column of the matrix $\tau$ corresponding to $x=\alpha^4$, the vector $[0\ 0\ 0\ 1]^T$ is obtained;

By multiplying this inverse matrix by the eighth column of the matrix $\tau$ corresponding to $x=\alpha^7$, the vector $[0\ \alpha^9\ \alpha^9\ 0]^T$ is obtained;

By multiplying this inverse matrix by the eleventh column of the matrix $\tau$ corresponding to $x=\alpha^{10}$, the vector $[0\ 0\ 0\ 0]^T$ is obtained;

By multiplying this inverse matrix by the fourteenth column of the matrix $\tau$ corresponding to $x=\alpha^{13}$, the vector $[0\ 0\ 0\ 0]^T$ is obtained.

In the aggregate indexed by $x=\alpha$, there is thus a single non-zero error. It corresponds to $y=\alpha^8$ and the value of that error is $\alpha^{12}$;

in the aggregate indexed by $x=\alpha^4$, there is thus a single non-zero error. It corresponds to $y=\alpha^8$ and the value of that error is 1;

in the aggregate indexed by $x=\alpha^7$, there are thus two non-zero errors corresponding to $y=\alpha^2$ and to $y=\alpha^4$ and the value of both these errors is $\alpha^9$;

in the aggregate indexed by $x=\alpha^{10}$, all the errors are zero;

in the aggregate indexed by $x=\alpha^{13}$, all the errors are zero.

When these estimated values of error are subtracted from the corresponding components of the received word, the zero symbol is obtained everywhere.

Similar calculations may be carried out for both the other classes of aggregates corresponding respectively to $x=1, \alpha^3, \alpha^6, \alpha^9, \alpha^{12}$ and to $x=\alpha^2, \alpha^5, \alpha^8, \alpha^{11}, \alpha^{14}$. In all cases, by subtracting the estimated values of error from the corresponding components of the received word, the zero symbol is obtained everywhere. The decoded word is thus the zero word.

In the general case, the aggregates do not necessarily all have the same size. This is the case if the code, although constructed on a maximum curve of type C(a, b), that is to say having aq points over $F_q$, is shortened. This is also the case, more fundamentally, if for the curve of type C(a, b) given by the equation $F(X,Y)=0$, there are different values $x_1$ and $x_2$ in $F_q$, for which the number of solutions at Y (in $F_q$) of $F(x_1, Y)=0$ and of $F(x_2, Y)=0$ is different.

For example, with a=4, if there are available the four polynomials $$S_j(Z) = \sum_{i=0}^{q-2} \sigma_j(i) Z^i,$$

$j = 0, \ldots, 3$, from which can be calculated the four vectors $\tau_j=\sigma_j V^{-1}$, where $\sigma_j$ is the vector of the $\sigma_j(i)$. In equivalent manner, $\tau_j$ is the vector having in position h, $0 \leq h \leq q-2$, the value of the polynomial $S_j(Z)$ evaluated in $Z=\alpha^{-h}$ with $\alpha$ primitive in $F_q$.

If for example the case is taken in which the aggregate corresponding to $X=x$ only contains three coordinates denoted $(x, y_1(x))$, $(x, y_2(x))$ and $(x, y_3(x))$, there are four equations relating to the three unknowns $\hat{e}(x, y_s(x))$, s=1, 2, 3:

$\hat{e}(x,y_1(x))+\hat{e}(x,y_2(x))+\hat{e}(x,y_3(x))=S_0(x^{-1})=\tau_0(x)$, $y_1(x)\hat{e}(x,y_1(x))+y_2(x)\hat{e}(x,y_2(x))+y_3(x)\hat{e}(x,y_3(x))=S_1(x^{-1})=\tau_1(x)$, $(y_1(x))^2\hat{e}(x,y_1(x))+(y_2(x))^2\hat{e}(x,y_2(x))+(y_3(x))^2\hat{e}(x,y_3(x))=S_2(x^{-1})=\tau_2(x)$, $(y_1(x))^3\hat{e}(x,y_1(x))+(y_2(x))^3\hat{e}(x,y_2(x))+(y_3(x))^3\hat{e}(x,y_3(x))=S_3(x^{-1})=\tau_3(x)$, that are written as $$\begin{bmatrix} \tau_0 \\ \tau_1 \\ \tau_2 \\ \tau_3 \end{bmatrix} = \begin{bmatrix} 1 & 1 & 1 \\ y_1 & y_2 & y_3 \\ y_1^2 & y_2^2 & y_3^2 \\ y_1^3 & y_2^3 & y_3^3 \end{bmatrix} \begin{bmatrix} e_1 \\ e_2 \\ e_3 \end{bmatrix}$$

where the arguments x and $y_i(x)$ have been omitted from the elements of the matrix and of the two vectors. In such a case, if no $y_i(x)$ is zero, it is possible to choose either the first three equations or the last three, from the four equations given above in matrix form. For example, if the last three are taken, calculation will be made of the three components $e_i$ of the error in the aggregate indexed by x by solving the system $$\begin{bmatrix} \tau_1 \\ \tau_2 \\ \tau_3 \end{bmatrix} = \begin{bmatrix} y_1 & y_2 & y_3 \\ y_1^2 & y_2^2 & y_3^2 \\ y_1^3 & y_2^3 & y_3^3 \end{bmatrix} \begin{bmatrix} e_1 \\ e_2 \\ e_3 \end{bmatrix}.$$

The first of the four equations is then usable to verify the consistency of the values $e_i$ so calculated.

Figure 2:
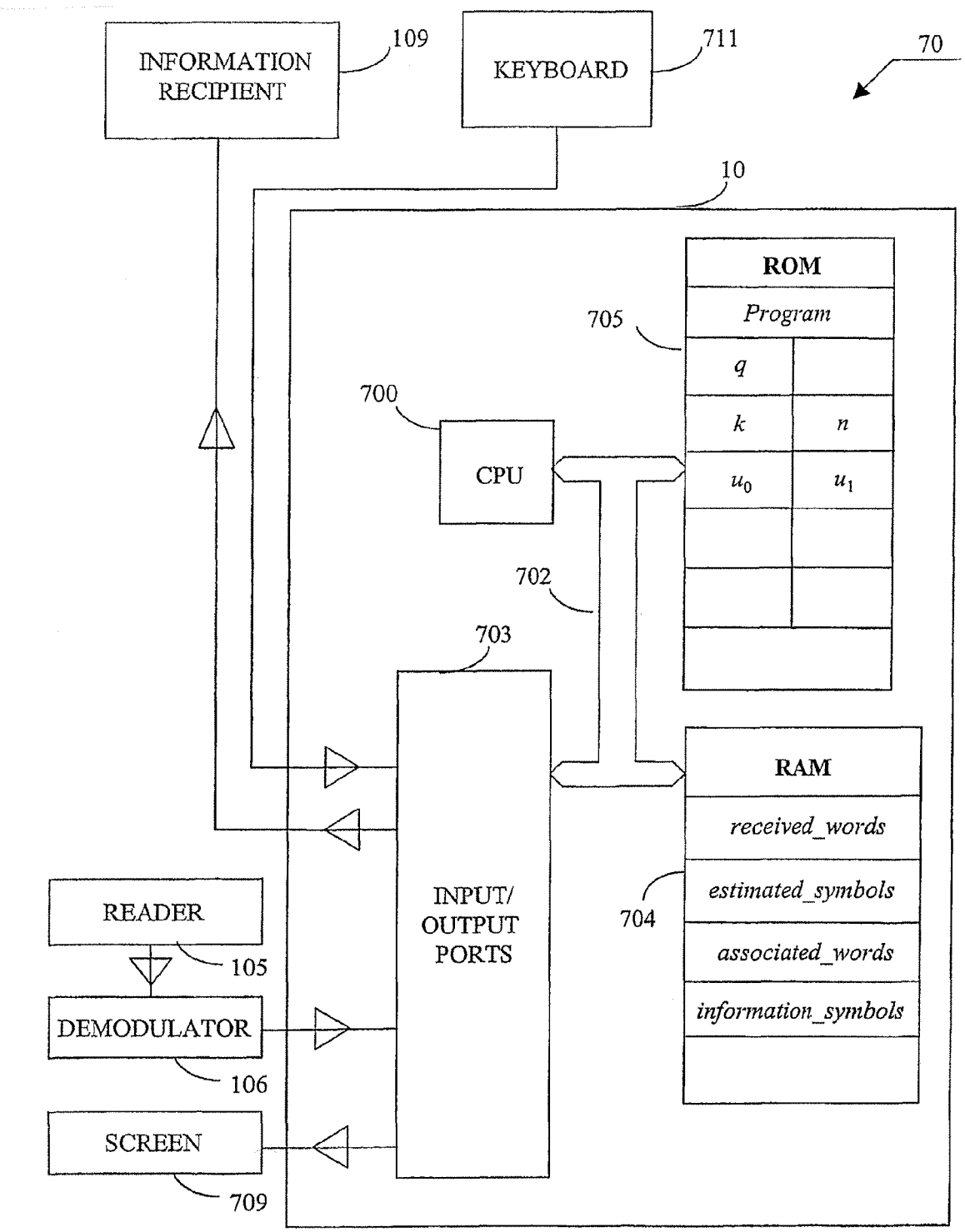
FIG. 2 represents an apparatus for receiving digital signals incorporating a decoder according to the invention.

The block diagram of FIG. 2 represents an apparatus for reading encoded digital signals 70, incorporating the decoder 10. This apparatus 70 comprises a keyboard 711, a screen 709, an external recipient of information 109, a data reader 105 and a demodulator 106, conjointly connected to input/output ports 703 of the decoder 10 which is produced here in the form of a logic unit.

The decoder 10 comprises, connected together by an address and data bus 702:
a central processing unit 700,
a random access memory (RAM) 704,
a read only memory (ROM) 705; and
said input/output ports 703.

Each of the elements illustrated in FIG. 2 is well known to the person skilled in the art of microcomputers and mass storage systems and, more generally, of information processing systems. These known elements are therefore not described here. It should be noted, however, that:
the information recipient 109 could be, for example, an interface peripheral, a display, a modulator, an external memory or another information processing system (not shown), and could be adapted to receive sequences of signals representing speech, service messages or multimedia data in particular of the IP or ATM type, in the form of sequences of binary data,
the reader 105 is adapted to read data recorded on a carrier such as a magnetic or magneto-optical disk.

The random access memory 704 stores data, variables and intermediate processing results, in memory registers bearing, in the description, the same names as the data whose values they store. The random access memory 704 contains in particular the following registers:
registers "received_words", in which the received words are kept,
a register "estimated_symbols", in which are stored the symbols from a received word in course of correction,
a register "associated_words", in which are stored the symbols of the "associated codewords", and
a register "information_symbols", in which are stored the symbols resulting from the redundancy removal.

The read only memory 705 is adapted to store, in registers which, for convenience, have the same names as the data which they store:
the operating program of the central processing unit 700, in a register "program",
the length of each codeword in a register "n",
the number of information symbols in each code word, in a register "k", and
a table containing each word $Y^j X^i$ of which the components are equal to the value $\overline{Y^j X^i}$ by the monomial $Y^j X^i$ at the points of the locating set, for i=0, . . . , 2L−1 and j=0, . . . , $\Lambda_{max}$−1, where L is the total number of aggregates and $\Lambda_{max}$ is the size of the maximum aggregate, in a register "W".

An application of the invention to the mass storage of data has been described above by way of example, but it is clear that the methods according to the invention may equally well be implemented within a telecommunications network, in which case unit 105 could for example be a receiver adapted to implement a protocol for data packet transmission over a radio channel.

The invention claimed is:

1. A method of decoding a one-point algebraic geometric code defined on an algebraic curve being partitioned into aggregates, wherein the algebraic curve is of type C(a, b) represented by an equation F(X,Y)=0 of degree b in X and of degree a in Y over Fq, the method comprising:
calculating on a data processing device extended error syndromes ($\sigma_j(i)$) associated with a received word (r), and
determining the values of errors in each component $r(x,y_p(x))$ of the received word r, on the basis of the extended error syndromes calculated, the determination comprising, for each aggregate:
calculating, on the basis of the extended error syndromes, compound error values ($\tau_j(h),E_j(x)$) each representing a linear combination of the errors in the components of the aggregate;
determining that the errors in the components of the aggregate are zero if all said compound error values are zero; and
calculating the errors in the components of the aggregate if at least one of said compound error values is not zero.

2. A decoding method according to claim 1, wherein the calculation of the extended error syndromes $\sigma_j(i)$ is performed for j =0,...$j_o$ −1, where $j_o$ is at least equal to the maximum value $\lambda_{max}$ of the cardinals $\lambda(x)$ of the aggregates of the code.

3. A decoding method according to claims 1 or 2, wherein the step of determining the values of errors includes:
calculating $\tau_j = \sigma_j \cdot V^{-1}$ for j =0, . . . , $\alpha$−1, where $V^{-1}$ is the matrix of dimensions (q−1) x (q−1) of which the element in position (i, j), 1 ≤j ≤q −1 , is $\alpha^{-(i-1)(j-1)}$, $\alpha$ being a primitive element of Fq;
for all h such that there is j such that $\tau_j(h) \neq 0$, calculating the error $\hat{e}(x,y_p(x))$ of the components of the aggregate defined by x =$\alpha^h$ in the received word by:

$$\begin{bmatrix} \hat{e}(\alpha^h, y_1(\alpha^h)) \\ \hat{e}(\alpha^h, y_2(\alpha^h)) \\ \vdots \\ \hat{e}(\alpha^h, y_{\lambda(\alpha^h)}(\alpha^h)) \end{bmatrix} = \begin{bmatrix} 1 & \cdots \cdots & 1 \\ y_1(\alpha^h) & \cdots \cdots & y_{\lambda(\alpha^h)}(\alpha^h) \\ \vdots & \cdots \cdots & \vdots \\ y_1^{\lambda(\alpha^h)-1}(\alpha^h) & \cdots \cdots & y_{\lambda(\alpha^h)}^{\lambda(\alpha^h)-1}(\alpha^h) \end{bmatrix}^{-1} \cdot \begin{bmatrix} \tau_0(h) \\ \tau_1(h) \\ \vdots \\ \tau_{\lambda(\alpha^h)-1}(h) \end{bmatrix}.$$

4. A decoding method according to claim 3, wherein for each j, the calculation of the elements of the vector $\tau_j$ is performed by a circuit comprising a shift register and receiving as input the elements of the vector $\sigma_j$.

5. A decoding method according to claim 3, wherein if there is at least one value of x =$\alpha^h$ associated with an erroneous aggregate of cardinal $\lambda(x)$ <$\alpha$, comparison is made between the members of at least one equation $$E_j(x) = \sum_{p=1}^{\lambda(x)} [y_p(x)]^j \hat{e}(x, y_p(x)),$$

where $\lambda(x) \leq j < \alpha-1$, associated with said value of x, if need be after having calculated $E_j(x)$ by means of an error correction algorithm adapted to Reed-Solomon codes.

6. A decoding method according to claims 1 or 2, wherein the step of determining the values of errors includes:
   implementing, for $j=0,\ldots,\lambda_{max}-1$, by means of the error syndromes polynomial $$S_J(z) = \sum_{i=0}^{q-2} \sigma_j(i) z^i,$$

an error correction algorithm adapted to Reed-Solomon codes, so as to calculate the error $E_j(x)$ in each component labeled by the element x of Fq of a word of Reed-Solomon code defined over Fq; and
   calculating the estimations $\hat{e}(x,y_p(x))$ of the respective errors in the components $r(x,_p(x))$ of r by solving the system of equations of type $$E_j(x) = \sum_{p=1}^{\lambda(x)} [y_p(x)]^j \hat{e}(x, y_p(x)),$$

where equations are chosen that are associated with consecutive values of j at least equal in number to the number of components $\lambda(x)$ of the aggregate considered.

7. A decoding method according to claim 6, wherein the calculation of the estimations $\hat{e}(x,y_p(x))$ is performed only for the values of x such that there is at least one value of j for which $E_j(x)$ is non-zero.

8. An error correction device for a one-point algebraic geometric code defined on an algebraic curve being partitioned into aggregates, wherein the algebraic curve is of type C(a, b) represented by an equation $F(X,Y)=0$ of degree b in X and of degree $\alpha$ in Y over Fq, the error correction device comprising:
   means for calculating extended error syndromes $(\sigma_j(I))$ associated with a received word (r), and
   means for determining the values of errors in each component $r(x, y_p(x))$ of the received word r, on the basis of the extended error syndromes calculated, the means for determining comprising:
   means for calculating, for each aggregate and on the basis of the extended error syndromes, compound error values $(\tau_j(h), E_j(x))$ each representing a linear combination of the errors in the components of the aggregate;
   means for determining that the errors in the components of an aggregate are zero if all said compound error values relative to that aggregate are zero; and
   means for calculating the errors in the components of an aggregate if at least one of said compound error values relative to that aggregate is not zero.

9. An error correction device according to claim 8, wherein the means for calculating the extended error syndromes $\sigma_j(I)$ are implemented for $j=0,\ldots,j_o-1$, where $j_o$ is at least equal to the maximum value $\lambda_{max}$ of the cardinals $\lambda(x)$ of the aggregates of the code.

10. An error correction device according to claims 8 or 9, wherein the means for determining the values of errors include:
   means for calculating $\tau_j = \tau_j \cdot V^{-1}$ for $j=0,\ldots,a-1$, where $V^{-1}$ is the matrix of dimensions $(q-1) \times (q-1)$ of which the element in position (i,j), $1 \leq i,j \leq q-1$, is $\alpha^{-(i-1)(j-1)}$, $\alpha$ being the primitive element of Fq; and
   means for calculating, for all h such that there is j such that $\tau_j(h) \neq 0$, the error $\hat{e}(x,y_p(x))$ of the components of the aggregate defined by $x=\alpha^h$ in the received word r by:

$$\begin{bmatrix} \hat{e}(\alpha^h, y_1(\alpha^h)) \\ \hat{e}(\alpha^h, y_2(\alpha^h)) \\ \vdots \\ \hat{e}(\alpha^h, y_{\lambda(\alpha^h)}(\alpha^h)) \end{bmatrix} =$$

$$\begin{bmatrix} 1 & \cdots & \cdots & 1 \\ y_1(\alpha^h) & \cdots & \cdots & y_{\lambda(\alpha^h)}(\alpha^h) \\ \vdots & \cdots & \cdots & \vdots \\ y_1^{\lambda(\alpha^h)-1}(\alpha^h) & \cdots & \cdots & y_{\lambda(\alpha^h)}^{\lambda(\alpha^h)-1}(\alpha^h) \end{bmatrix}^{-1} \cdot \begin{bmatrix} \tau_0(h) \\ \tau_1(h) \\ \vdots \\ \tau_{\lambda(\alpha^h)-1}(h) \end{bmatrix}.$$

11. An error correction device according to claim 10, wherein the error correction device includes, for each j, a circuit comprising a shift register that receives as input the elements of the vector $\sigma_j$ to calculate the elements of the vector $\tau_j$.

12. An error correction device according to claim 10, further comprising:
   means for comparing, if there is at least one value of $x=\alpha^h$ associated with an erroneous aggregate of cardinal $\lambda(x) < \alpha$, between the members of at least one equation $$E_j(x) = \sum_{p=1}^{\lambda(x)} [y_p(x)]^j \hat{e}(x, y_p(x)),$$

where $\lambda(x) \leq j < \alpha-1$, associated with said value of x.

13. An error correction device according to claims 8 or 9, wherein the means for determining the values of errors include:
   means for implementing, for $j=0,\ldots,\lambda_{max}-1$, by means of the error syndromes polynomial $$S_J(z) = \sum_{i=0}^{q-2} \sigma_j(i) z^i,$$

an error correction algorithm adapted to Reed-Solomon codes, so as to calculate the error $E_j(x)$ in each component labeled by the element x of Fq of a word of Reed-Solomon code defined over Fq; and
   means for calculating the estimations $\hat{e}(x,y_p(x))$ of the respective errors in the components $r(x, y_p(x))$ of r by solving the system of equations of type $$E_j(x) = \sum_{p=1}^{\lambda(x)} [y_p(x)]^j \hat{e}(x, y_p(x)), \quad (3)$$

where equations are chosen that are associated with consecutive values of j at least equal in number to the number of components λ(x) of the aggregate considered.

14. An error correction device according to claim 13, wherein the means for calculating the estimations ê(x,$y_p$(x)) are implemented only for the values of x such that there is at least one value of j for which $E_j$(x) is non-zero.

15. A decoder comprising:
    at least one error correction device according to claim 8, and
    at least one redundancy removal unit.

16. An apparatus for receiving encoded digital signals comprising:
    a decoder according to claim 15; and
    means for demodulating said encoded digital signals.

17. A computer system comprising:
    a decoder according to claim 15;
    at least one hard disk; and
    at least one means for reading the hard disk.

18. Non-removable data storage means storing instructions which, when executed by a data processing device, cause the data processing device to perform a method according to claim 1.

19. Partially or wholly removable data storage means storing instructions which, when executed by a data processing device, cause the data processing device to perform a method according to claim 1.

20. A non-transitory computer-readable medium containing instructions which, when executed by a programmable data processing device, cause said data processing device to perform a method according to claim 1.

* * * * *